(12) United States Patent
Coteus et al.

(10) Patent No.: US 10,939,543 B2
(45) Date of Patent: Mar. 2, 2021

(54) UNIFIED CONDUCTOR TO LOWER THE RESISTANCE BETWEEN A PLANAR TRANSFORMER AND ONE OR MORE INDUCTORS

(71) Applicant: International Business Machines Corporation, Armonk, NY (US)

(72) Inventors: Paul W Coteus, Yorktown, NY (US); Andrew Ferencz, Southborough, MA (US); Todd Takken, Brewster, NY (US); Yuan Yao, Tarrytown, NY (US); Xin Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 15/858,432

(22) Filed: Dec. 29, 2017

(65) Prior Publication Data

US 2019/0208624 A1 Jul. 4, 2019

(51) Int. Cl.
| | |
|---|---|
| *H01F 5/00* | (2006.01) |
| *H05K 1/02* | (2006.01) |
| *H05K 1/16* | (2006.01) |
| *H01F 27/28* | (2006.01) |
| *H01F 27/06* | (2006.01) |

(Continued)

(52) U.S. Cl.
CPC .......... *H05K 1/0265* (2013.01); *H01F 27/06* (2013.01); *H01F 27/24* (2013.01); *H01F 27/28* (2013.01); *H01F 41/04* (2013.01); *H05K 1/165* (2013.01); *H01F 2027/065* (2013.01); *H05K 2201/086* (2013.01); *H05K 2201/10272* (2013.01); *H05K 2203/1476* (2013.01)

(58) Field of Classification Search
USPC .................................. 336/200, 232, 192, 198
See application file for complete search history.

(56) References Cited

U.S. PATENT DOCUMENTS

| | | | | |
|---|---|---|---|---|
| 5,565,837 | A | * 10/1996 | Godek | ................ H01F 17/0006 |
| | | | | 174/250 |
| 5,631,822 | A | 5/1997 | Silberkleit et al. | |

(Continued)

FOREIGN PATENT DOCUMENTS

| | | |
|---|---|---|
| CN | 202513015 U | 10/2012 |
| JP | 2013073956 A | 4/2013 |

OTHER PUBLICATIONS

Current Sharing Between Parallel Turns of a Planar Transformer: Prediction and Improvement Using a Circuit Simulation Software Xavier Margueron; Abdelhadi Besri; Yves Lembeye; Jean-Pierre Keradec IEEE Transactions on Industry Applications Year: May/Jun. 2010, vol. 46, Issue: 3, pp. 1064-1071.

*Primary Examiner* — Elvin G Enad
*Assistant Examiner* — Kazi S Hossain
(74) *Attorney, Agent, or Firm* — Harrington & Smith (57) ABSTRACT

An apparatus is provided including a transformer including a first printed circuit board having one or more conducting layers, the one or more conducting layers forming, at least in part, a transformer coil; at least one inductor; and at least one continuous piece of conducting material external to the printed circuit board, where the at least one continuous piece of conducting material forms a connection between the transformer and the at least one inductor. A method is also provided for assembling a switched-mode power supply.

14 Claims, 8 Drawing Sheets

(51) Int. Cl.
*H01F 27/24* (2006.01)
*H01F 41/04* (2006.01)

(56) References Cited

U.S. PATENT DOCUMENTS

| | | |
|---|---|---|
| 5,777,539 A | 7/1998 | Folker et al. |
| 6,320,490 B1 | 11/2001 | Clayton |
| 6,489,876 B1 | 12/2002 | Jitaru |
| 6,608,545 B2 | 8/2003 | Fricker et al. |
| 6,927,661 B2 | 8/2005 | He et al. |
| 7,289,329 B2 | 10/2007 | Chen et al. |
| 7,295,094 B2 | 11/2007 | Jitaru et al. |
| 7,671,714 B2 | 3/2010 | Tiemeijer |
| 7,872,560 B2 | 1/2011 | Hsu |
| 2004/0032313 A1* | 2/2004 | Ferencz ............... H01F 27/266 336/200 |
| 2004/0135662 A1 | 7/2004 | Harding |
| 2008/0211613 A1* | 9/2008 | Lin .................... H01F 27/2866 336/83 |
| 2009/0128277 A1* | 5/2009 | Moiseev ................ H01F 3/12 336/170 |
| 2017/0200552 A1* | 7/2017 | Chung ............... H01F 27/2885 |

\* cited by examiner

TO MAIN CIRCUIT BOARD

UNIFIED CONDUCTOR TO LOWER THE RESISTANCE BETWEEN A PLANAR TRANSFORMER AND ONE OR MORE INDUCTORS

GOVERNMENT RIGHTS

This invention was made with Government support under Contract No.: B599858 awarded by Department of Energy. The Government has certain rights in this invention.

TECHNICAL FIELD

This invention relates generally to power supplies and, more specifically, relates to a unified conductor to lower the resistance between a planer transformer and one or more inductors in power supplies.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Transformers and inductors are critical in many modern electronic applications, such as switched mode power supplies for example. Typically, a switched mode power supply (SMPS) employs a transformer, such as a planer transformer for example, and one or more inductors. A transformer is sometimes beneficial when the input to output voltage ratio is larger than 4 or smaller than ¼ and is often necessary when this ratio is larger than 12 or smaller than 1/12. An inductor is usually required for a SMPS to perform voltage or current regulation. Multiple inductors are required to create a multi-phase power supply. The AC and DC resistances of the transformer windings and inductor winding are critical to the overall efficiency of the SMPS. A lower resistance means lower resistive loss in the transformer, in the inductors, and in the connections between transformer and inductors, thereby resulting in lower resistive loss in the SMPS.

BRIEF SUMMARY

This section is intended to include examples and is not intended to be limiting.

In an example of an embodiment, an apparatus includes: a transformer comprising a printed circuit board having one or more conducting layers, the one or more conducting layers forming, at least in part, a transformer coil; at least one inductor; and at least one continuous piece of conducting material external to the printed circuit board, wherein the at least one continuous piece of conducting material forms a connection between the transformer and the at least one inductor.

In another example of an embodiment, a method for assembling a switched-mode power supply, the method including: providing a printed circuit board having one or more conducting layers, at least one continuous piece of conducting material, at least two transformer core pieces, and one or more inductor core pieces; forming a transformer by arranging at least a part of the printed circuit board and at least a part of the at least one continuous piece of conducting material between the at least two transformer core pieces to form a transformer, wherein a transformer coil of the transformer is formed by the one or more conducting layers of the printed circuit board and the at least one continuous piece of material; and forming an inductor by arranging at least a part of the at least one continuous piece of material either inside one of the one or more inductor core pieces or between two or more of the inductor core pieces, wherein a inductor coil of the inductor is formed at least in part by the at least one continuous piece of material, and wherein the at least one continuous piece of material is external to the printed circuit board and forms a connection between the inductor and the transformer.

BRIEF DESCRIPTION OF THE DRAWINGS

These and other features, aspects, and advantages of the present invention will become better understood with regard to the following description, appended claims, and accompanying drawings, where:

DETAILED DESCRIPTION

In the Summary above and in the Detailed Description and the claims below, and in the accompanying drawings, reference is made to particular features (including method steps) of the invention. It is to be understood that these various features may be combined despite that the description herein does not explore explicitly every single such possible combination. The specific embodiments that are detailed with particularity herein are not a limit to the general teachings herein, and such exemplary embodiments by themselves are not a limit to the scope of the ensuing claims but rather teach the principles of the invention and illuminate the meaning of such ensuing claims.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Exemplary embodiments herein generally describe techniques for lowering the resistance between a planar transformer and one or more inductors using a unified conductor. More specifically, exemplary embodiments described herein include both a transformer and one or more inductors, where the transformer is connected to the one or more inductors using continuous pieces of conducting material separate from the circuit board of, for example, a power supply. By using a unified conductor to connect the transformer and the one or more inductors, the resistance between them can be lowered. The unified conductor also allows the mechanical rigidity to be improved and the cost lowered as there are fewer separate conducting components required.

Figure 1A:
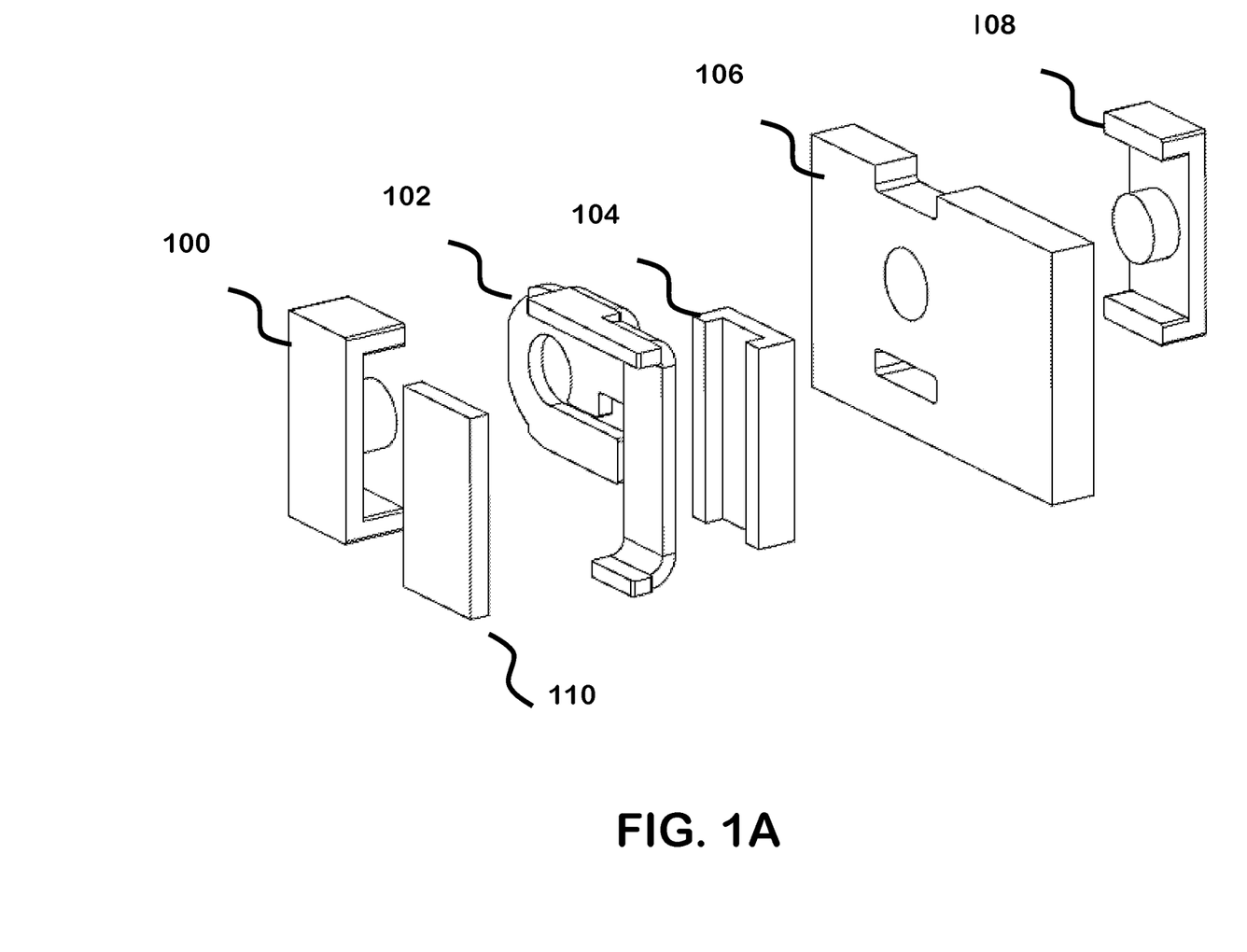
FIGS. 1A-1B show expanded and assembled views of a structure in accordance with an example embodiment.
Figure 1B:
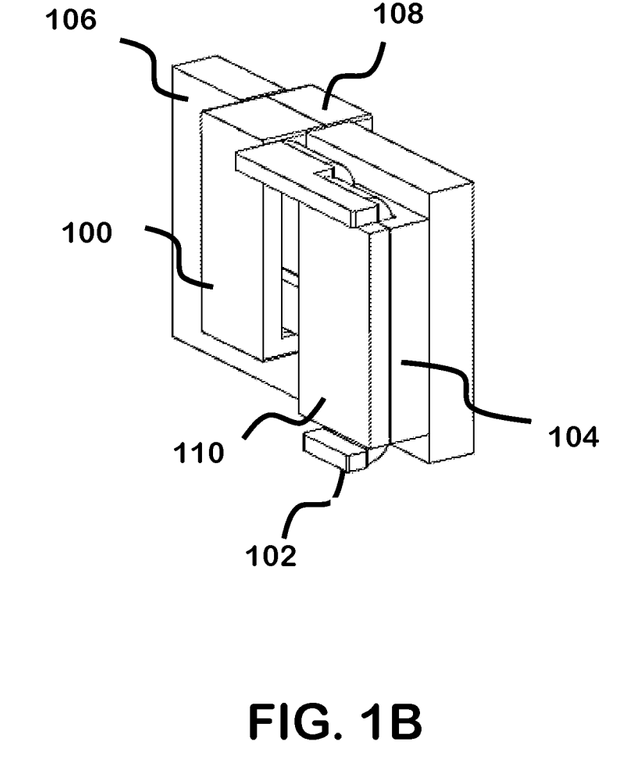

Referring now to FIGS. 1A-1B, these figures show expanded and assembled views of a structure in accordance with an example embodiment. The example structure in FIG. 1 shows a unified conductor between a transformer and an inductor. In particular, the example structure includes a printed circuit board 106; magnetic (ferrite) core pieces 100, 108 of the transformer; magnetic (ferrite) core pieces 104, 110 of the inductor; and a unified conductor 102. The printed circuit board 106 includes one or more internal metal layers that form, in part, the coils of the planar transformer. In this example, the unified conductor 102 forms part of the transformer secondary coil, forms the inductor coil and connects the planar transformer and the inductor. The separate components in FIG. 1A, along with other components which form a power supply, can be assembled as part of a standard automated circuit board assembly process. For each surface of the circuit board solder paste or glue is deposited onto desired areas of the circuit board. Then components including the unified conductor and ferrite pieces are placed by machine onto the circuit board. The structure is then passed through an oven, in order to allow the solder paste or glue to adhere the components onto the circuit board.

Figure 2A:
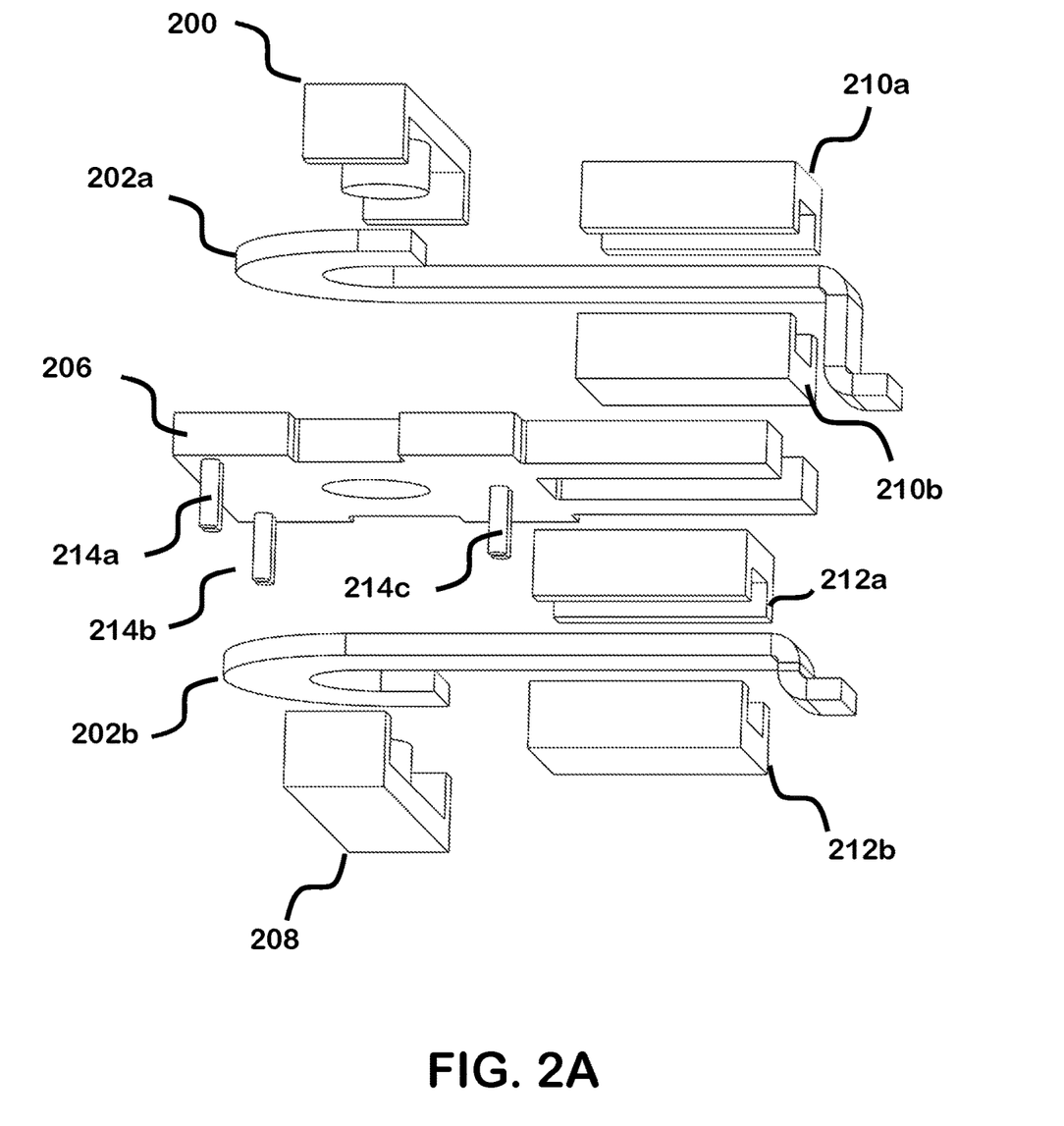
FIGS. 2A-2C show expanded and assembled views of another structure in accordance with an example embodiment.
Figure 2B:
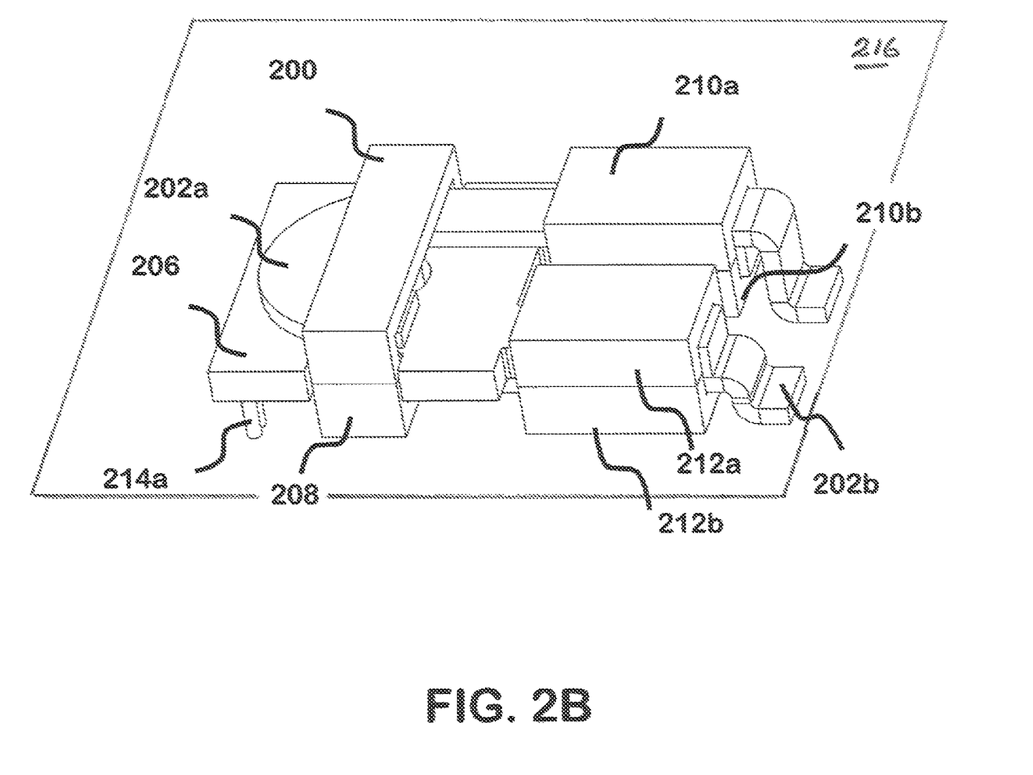
Figure 2C:
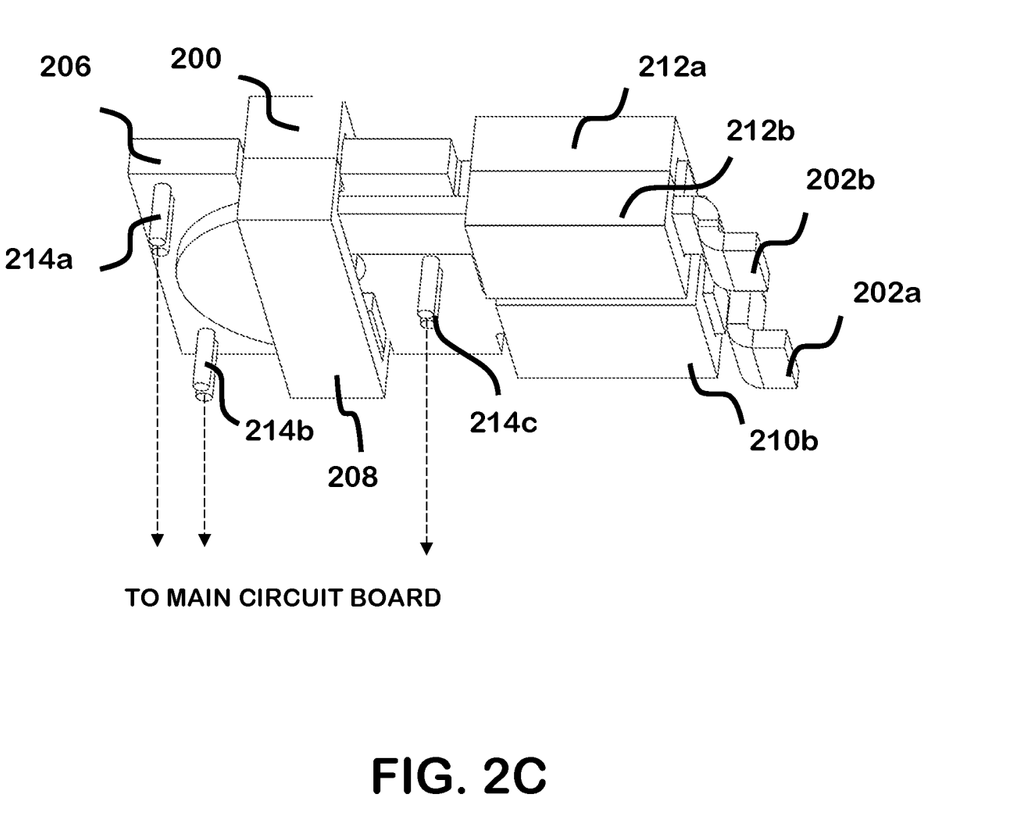

FIGS. 2A-2C illustrate an example structure including two unified conductors between a planar transformer and two inductors in accordance with an embodiment. In particular, FIG. 2A and FIGS. 2B-2C show an expanded view and assembled views of the example structure, respectively. In this example, the structure includes two unified conductors 202a, 202b which make connections between the transformer and the inductors in parallel with extensions of the printed circuit board 206. More specifically, a planer transformer is shown that includes: transformer coils formed by one or more metal layers of a printed circuit board 206, and magnetic core pieces 200, 208. The two unified conductors 202a, 202b join a first and a second inductor to the planer transformer, respectively. The first inductor includes: a first inductor coil formed by the unified conductors 202a and one of the extensions of the printed circuit board 206, and the inductor core pieces 210a, 210b. The second inductor includes: a second inductor coil formed by the unified conductors 202b and the other extension of the printed circuit board 206, and the inductor core pieces 212a, 212b. In other words, the unified conductor 202a, forms part of the transformer secondary coil, forms part of the first inductor coil and makes the connection from the planar transformer to the first inductor, and the unified conductor 202b forms part of the transformer coil, forms part of the second inductor coil and makes the connection from the planar transformer to the second inductor. Also shown in FIGS. 2A and 2B are electrical pins 214a, 214b and 214c which are used to carry electrical signals into or out of the printed circuit board 206. Pulse modulation input, clock input, current measurement output and control signals are examples of electrical signals that might need to be carried between the assembled power supply shown in FIGS. 2A-2C and a main system circuit board 216 onto which the power supply is mounted as represented in FIGS. 2B-2C for example.

Figure 3A:
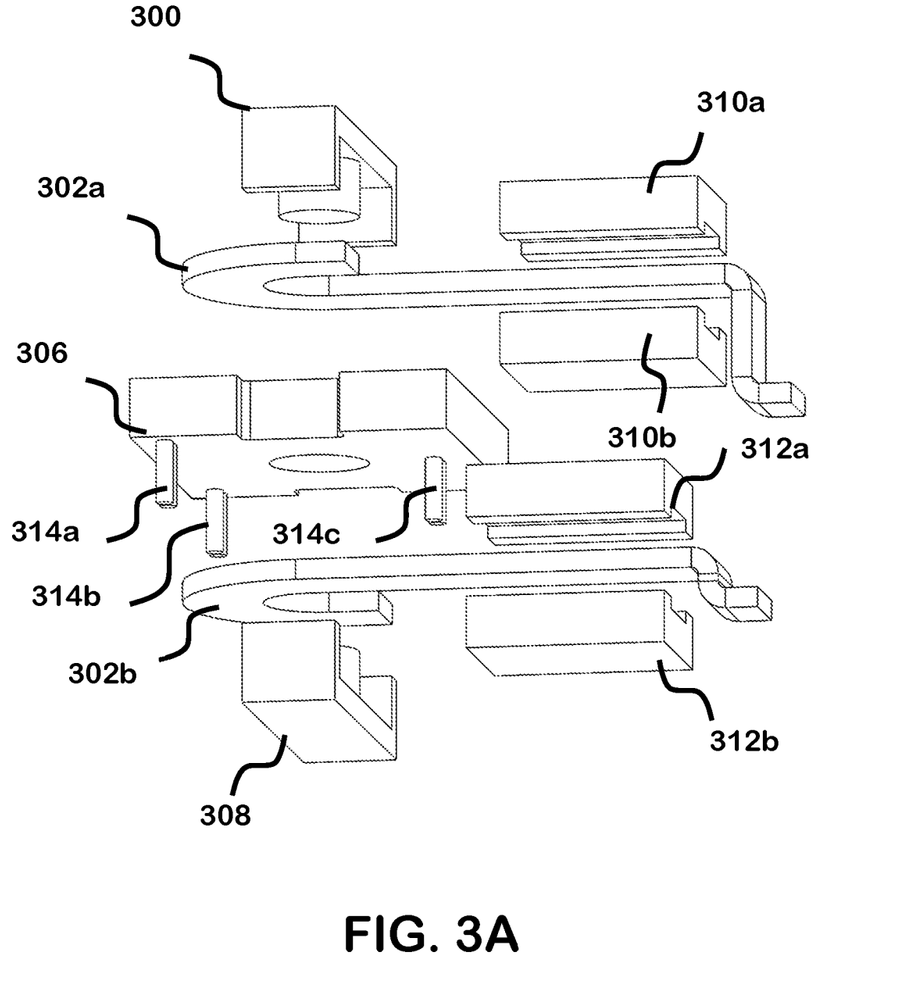
FIGS. 3A-3C a show expanded and assembled views of another structure in accordance with an example embodiment.
Figure 3B:
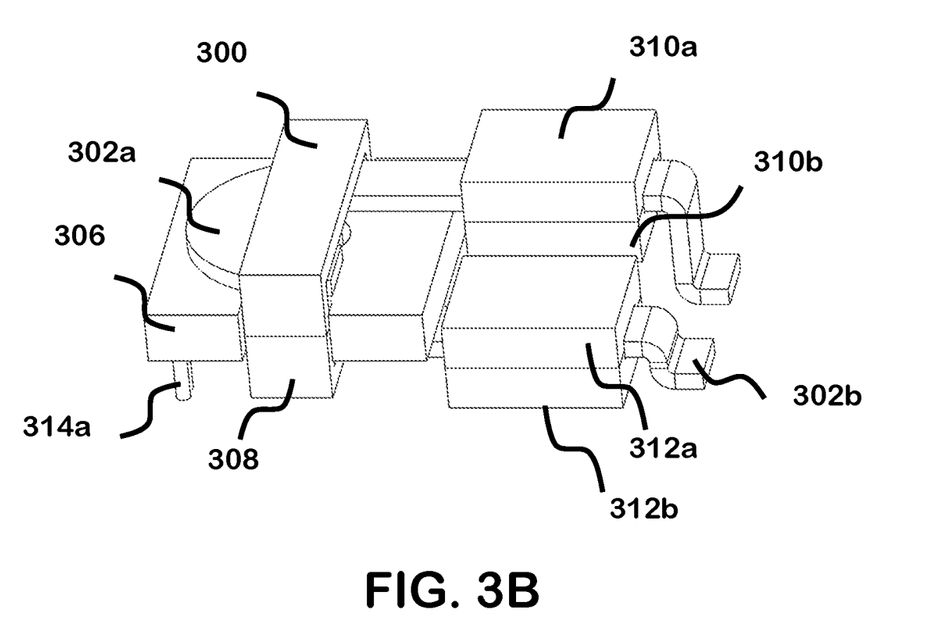
Figure 3C:
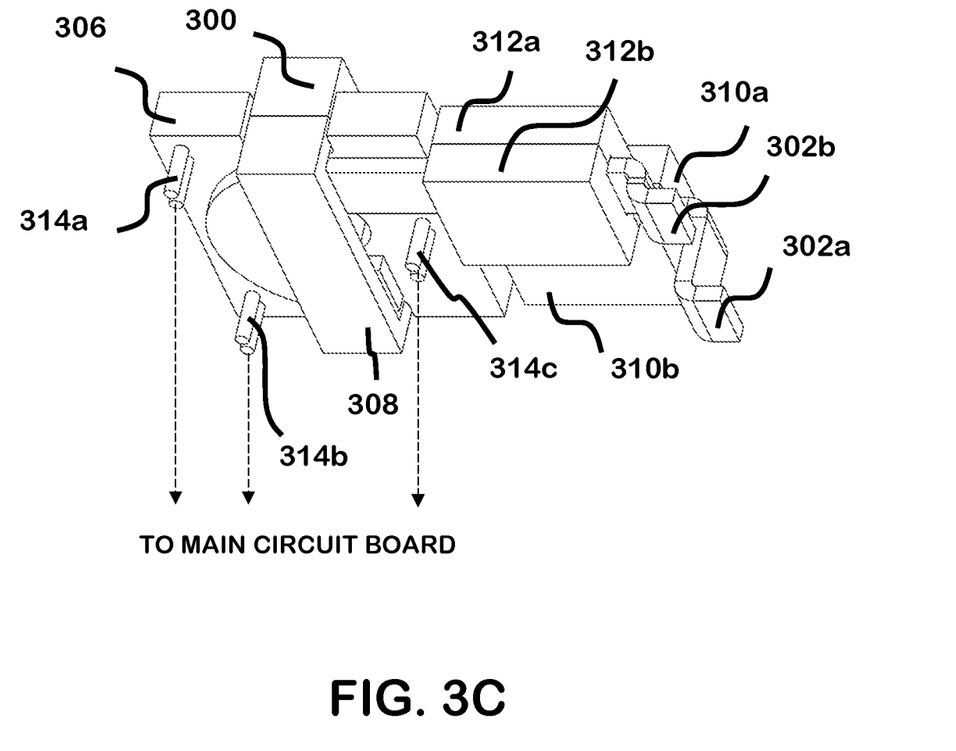

FIGS. 3A-3C illustrate another example structure including two unified conductors between a planar transformer and two inductors in accordance with an example embodiment. In particular, FIG. 3A and FIGS. 3B-3C show an expanded view and assembled views of the example structure, respectively.

The structure in this example includes two unified conductors 302a, 302b which form exclusive connections between the planer transformer and the two inductors. More specifically, a planer transformer is shown that includes: transformer coils formed, in part, by one or more metal layers of printed circuit board 306, and magnetic core pieces 300, 308. The structure also includes a first and a second inductor having respective first and second inductor coils formed by unified conductors 302a, 302b. The first and second inductors are also formed by the respective magnetic core pieces 310a, 310b, 312a, 312b. In addition to forming the inductor coils, each of the unified conductors 302a, 302b also form part of the secondary transformer coil and make connections from the planar transformer to the first and second inductors. Unlike FIGS. 2A-2C, the first inductor coil is formed in its entirety by the unified conductor 302a, and the second inductor coil is formed in its entirety by unified conductor 302b. Also shown in FIGS. 3A-3C are electrical pins 314a, 314b, 314c which carry electrical signals into or out of the printed circuit board 306. Similar to FIGS. 2A-2C, examples of electrical signals include pulse modulation input, clock input, current measurement output and control signals that might need to be carried between the assembled power supply shown in FIGS. 3A-3C and a main system circuit board onto which the power supply is mounted, as shown in FIG. 3C for example.

It is noted that the unified conductors 102, 202a, 202b, 302a, 302b in the examples above may each be comprised of one continuous piece of conducting material, such as copper for example. As the unified conductor is external to the printed circuit board different thicknesses and/or amounts of the conducting material can be used (as a non-limiting example the conducting material may be 1.0 mm thick sheet copper, which could be an order of magnitude thicker than each of the four ounce copper layers internal to the circuit board). The various example structures described above may be implemented in power supplies, such as DC-DC or AC-DC converters for example.

It is further noted that the structures referred to in the figures above are merely examples and other arrangements are also possible without departing from scope of these teachings. Those skilled in that art will appreciate, for example, that the structures could include more than two inductors and/or unified conductors and/or the shapes of the various components in the structure may be different. Further, in some examples a single cylindrical ferrite could be used to form one of the inductors shown in FIGS. 1A-3C. For example, instead of using two core pieces, one could press-form a single cylindrical ferrite core piece and slide the core piece over a protruding end of a circuit board and/or continuous piece of conducting material.

According to an example embodiment, an apparatus is provided including: a transformer comprising a printed circuit board having one or more conducting layers, the one or more conducting layers forming, at least in part, a transformer coil; at least one inductor; and at least one continuous piece of conducting material external to the printed circuit board, wherein the at least one continuous piece of conducting material forms a connection between the transformer and the at least one inductor.

The at least one inductor may include an inductor coil formed at least in part by the at least one continuous piece of conducting material connecting the transformer and the at least one inductor. The inductor coil may be formed by one or more conducting layers of the printed circuit board and the at least one continuous piece of conducting material connecting the transformer and the at least one inductor. The inductor coil may be formed exclusively by the at least one continuous piece of conducting material connecting the transformer and the at least one inductor. The transformer coil may be formed by both the at least one continuous piece of conducting material and the one or more conducting layers of the printed circuit board. The at least one inductor may include a first inductor and a second inductor, and the at least one continuous piece of conducting material may include: a first continuous piece of conducting material connecting the first inductor to the transformer; and a second continuous piece of conducting material connecting the second continuous piece of conducting material connects the second inductor to the transformer. The first and second continuous pieces of conducting material may be connected to the transformer in parallel. The first continuous piece of conducting material and one or more of the layers of the printed circuit board may form a first inductor coil of the first inductor, and one or more of the layers of the printed circuit board and the second continuous piece of conducting material may form a second inductor coil of the second conductor. The first continuous piece of conducting material may form a first inductor coil of the first inductor in its entirety, and the second continuous piece of conducting material may form a second inductor coil of the second inductor in its entirety. The apparatus may include one or more electrical pins connected to the printed circuit board for carrying one or more signals from the printed circuit board to another circuit board and/or to the printed circuit board from the other circuit board. The transformer may be a planer transformer. The at least one inductor may be a planer inductor. The transformer may include at least two first magnetic parts that form a magnetic core of the transformer. The at least one inductor may include one or more second magnetic parts that form a magnetic core of the inductor. A switched mode power supply may include the apparatus. An electronic device may include a main circuit board and the assembled switch mode power supply, wherein the switched mode power supply is mounted to the main circuit board.

According to one example embodiment, a method is provided for assembling a switched-mode power supply, the method including: providing a printed circuit board having one or more conducting layers, at least one continuous piece of conducting material, at least two transformer core pieces, and one or more inductor core pieces; forming a transformer by arranging at least a part of the printed circuit board and at least a part of the at least one continuous piece of conducting material between the at least two transformer core pieces to form a transformer, wherein a transformer coil of the transformer is formed by the one or more conducting layers of the printed circuit board and the at least one continuous piece of material; and forming an inductor by arranging at least a part of the at least one continuous piece of material either inside one of the one or more inductor core pieces or between two or more of the inductor core pieces, wherein a inductor coil of the inductor is formed at least in part by the at least one continuous piece of material, and wherein the at least one continuous piece of material is external to the printed circuit board and forms a connection between the inductor and the transformer.

The method may further include mounting the assembled switched mode power supply to a main circuit board.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. An apparatus comprising:
a printed circuit board having one or more conducting internal layers, the one or more conducting internal layers forming, at least in part, a transformer coil of a transformer;
at least one continuous piece of conducting material external to the printed circuit board, the at least one continuous piece of conducting material forming at least part of a secondary coil for the transformer;
at least one inductor; and
a connection between the transformer and the at least one inductor, whereby resistive loss between the transformer and the at least one inductor is reduced;
at least two first magnetic parts forming a magnetic core of the transformer; and
one or more second magnetic parts forming a magnetic core of the at least one inductor, said one or more second magnetic parts being separate from said at least two first magnetic parts, so that said secondary coil and said at least one inductor are magnetically separate devices.

2. The apparatus of claim 1, wherein the at least one inductor comprises an inductor coil formed at least in part by the at least one continuous piece of conducting material connecting the transformer and the at least one inductor.

3. The apparatus of claim 2, wherein the inductor coil is formed by one or more conducting layers of the printed circuit board and the at least one continuous piece of conducting material connecting the transformer and the at least one inductor.

4. The apparatus of claim 2, wherein the inductor coil is formed exclusively by the at least one continuous piece of conducting material connecting the transformer and the at least one inductor.

5. The apparatus of claim 1, wherein the transformer is formed by both the at least one continuous piece of conducting material and the one or more conducting layers of the printed circuit board.

6. The apparatus of claim 1, wherein:
the at least one inductor comprises a first inductor and a second inductor, and
the at least one continuous piece of conducting material comprises:
a first continuous piece of conducting material connecting the first inductor to the transformer; and
a second continuous piece of conducting material connecting the second continuous piece of conducting material connects the second inductor to the transformer.

7. The apparatus of claim 6, wherein the first and second continuous pieces of conducting material are connected to the transformer in parallel.

8. The apparatus of claim 6, wherein the first continuous piece of conducting material and one or more of the layers of the printed circuit board form a first inductor coil of the first inductor, and wherein one or more of the layers of the printed circuit board and the second continuous piece of conducting material form a second inductor coil of the second conductor.

9. The apparatus as in claim 6, wherein the first continuous piece of conducting material forms a first inductor coil of the first inductor in its entirety, and the second continuous piece of conducting material forms a second inductor coil of the second inductor in its entirety.

10. The apparatus of claim 1, further comprising one or more electrical pins connected to the printed circuit board for carrying one or more signals from the printed circuit board to another circuit board and/or to the printed circuit board from the other circuit board.

11. The apparatus of claim 1, wherein the transformer is a planar transformer.

12. The apparatus of claim 1, wherein the at least one inductor is a planar inductor.

13. The apparatus of claim 1, wherein the apparatus is a switched-mode power supply.

14. An electronic device comprising:
a main circuit board and a switched-mode power supply according to claim 13, wherein the switched-mode power supply is mounted to the main circuit board.

* * * * *